(12) United States Patent
Chu

(10) Patent No.: US 11,466,363 B2
(45) Date of Patent: Oct. 11, 2022

(54) SUBSTRATE FILM FORMING MACHINE TABLE AND USAGE METHOD

(71) Applicants:HKC CORPORATION LIMITED, Guangdong (CN); CHONGQING HKC OPTOELECTRONICS TECHNOLOGY CO., LTD., Chongqing (CN)

(72) Inventor: Chengliang Chu, Chongqing (CN)

(73) Assignees: HKC CORPORATION LIMITED, Shenzhen (CN); CHONGQIING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 156 days.

(21) Appl. No.: 16/975,805

(22) PCT Filed: Jul. 19, 2018

(86) PCT No.: PCT/CN2018/096285
§ 371 (c)(1),
(2) Date: Aug. 26, 2020

(87) PCT Pub. No.: WO2019/165749
PCT Pub. Date: Sep. 6, 2019

(65) Prior Publication Data
US 2020/0399752 A1  Dec. 24, 2020

(30) Foreign Application Priority Data

Mar. 2, 2018  (CN) .......................... 201810175922.4

(51) Int. Cl.
*C23C 14/56* (2006.01)
*C23C 14/54* (2006.01)
(Continued)

(52) U.S. Cl.
CPC ............ *C23C 14/564* (2013.01); *C23C 14/54* (2013.01); *H01L 21/02617* (2013.01); *H01L 21/67253* (2013.01); *H01L 22/30* (2013.01)

(58) Field of Classification Search
CPC ..... C23C 14/566; C23C 14/54; C23C 14/564; H01L 21/67253; H01L 22/30
See application file for complete search history.

(56) References Cited

U.S. PATENT DOCUMENTS 5,863,842 A     1/1999  Ohmi
10,121,686 B2 * 11/2018 Ogawa .................... F16K 51/02
(Continued)

FOREIGN PATENT DOCUMENTS

CN    103228914 A    7/2013
CN    104620370 A    5/2015
(Continued)

OTHER PUBLICATIONS

International Search Report for Application No. PCT/CN2018/096285, dated Dec. 3, 2018, 2 pages.
(Continued)

*Primary Examiner* — Jaehwan Oh

(57) ABSTRACT

A substrate film forming machine table and a usage method. The substrate film forming machine table comprises: a first substrate bearing inlet and outlet chamber; a second substrate bearing inlet and outlet chamber; a film forming chamber; an intermediate chamber; a pump set connected to the first substrate bearing inlet and outlet chamber; a second pump connected to the intermediate chamber; a third pump connected to the film forming chamber and the second substrate bearing inlet and outlet chamber; at least one backup pump, which is provided to connect to the film forming chamber and the second substrate bearing inlet and outlet chamber so as to extract air from the film forming chamber and the second substrate bearing inlet and outlet
(Continued)

chamber when the third pump is damaged; or, connecting to the intermediate chamber so as to extract air from the intermediate chamber when the second pump is damaged.

20 Claims, 9 Drawing Sheets

(51) Int. Cl.
*H01L 21/02* (2006.01)
*H01L 21/67* (2006.01)
*H01L 21/66* (2006.01)

(56) References Cited

U.S. PATENT DOCUMENTS

| | | | |
|---|---|---|---|
| 10,309,401 B2* | 6/2019 | Schofield | F04C 25/02 |
| 11,187,222 B2* | 11/2021 | Galtry | F04D 19/046 |
| 2007/0209973 A1 | 9/2007 | Gawer et al. | |
| 2017/0200622 A1* | 7/2017 | Shiokawa | C23C 14/22 |
| 2018/0003178 A1* | 1/2018 | Schofield | H01L 21/67155 |

FOREIGN PATENT DOCUMENTS

| | | |
|---|---|---|
| CN | 105552001 A | 5/2016 |
| CN | 107142464 A | 9/2017 |
| JP | 1991183767 A | 8/1991 |
| JP | 2006183152 A | 7/2006 |
| KR | 1020060010304 A | 2/2006 |

OTHER PUBLICATIONS

Chinese Office Action for Application No. 201810175922.4 dated Sep. 3, 2019, 14 pages.
Chinese Office Action for Application No. 201810175922.4 dated May 18, 2020, 10 pages.

* cited by examiner

SUBSTRATE FILM FORMING MACHINE TABLE AND USAGE METHOD

CROSS REFERENCE TO RELATED APPLICATIONS

This is a U.S. National Stage application of, and claims priority to, PCT/CN2018/096285, filed Jul. 19, 2018, which further claims priority to Chinese Patent Application No. 201810175922.4, filed Mar. 2, 2018, the disclosures of which are incorporated herein by reference in their entirety.

TECHNICAL FIELD

Embodiments of the present disclosure relate to display panel manufacturing technologies, and more particularly relate to a substrate film formation machine and a using method thereof.

BACKGROUND

With the continuous development of science and technologies, various display devices such as TVs, mobile phones and computers are increasingly popularized and are widely applied in various places where information needs to be displayed, for example, residences, shopping malls, and office buildings, and make production and life easier for people.

During manufacturing of a display device, to ensure that a display panel has a good display effect, a film formation process of an array substrate generally needs to be carried out in a vacuum environment. In an actual manufacturing process, a substrate film formation machine for implementing the film formation process of the array substrate usually includes a plurality of pumps. If one pump is damaged, the substrate film formation machine cannot work normally, and the whole machine needs to be stopped for repairing. This definitely affects the production efficiency of the substrate film formation machine.

SUMMARY

The present disclosure provides a substrate film formation machine and a using method thereof, so as to achieve the objective of improving the production efficiency of the substrate film formation machine.

An embodiment of the present disclosure provides a substrate film formation machine. The substrate film formation machine includes: a first substrate bearer in-out cavity; a second substrate bearer in-out cavity, the second substrate bearer in-out cavity being connected to the first substrate bearer in-out cavity; a film formation chamber, the film formation chamber being connected to the second substrate bearer in-out cavity; an intermediate chamber, the intermediate chamber being connected to the film formation chamber; a pump set, the pump set comprising a plurality of first pumps that are connected to the first substrate bearer in-out cavity, so as to pump out air in the first substrate bearer in-out cavity; a second pump, the second pump being connected to the intermediate chamber, so as to pump out air in the intermediate chamber; a third pump, the third pump being connected to the film formation chamber and the second substrate bearer in-out cavity, so as to pump out air in the film formation chamber and the second substrate bearer in-out cavity; and a first auxiliary pump, the first auxiliary pump being connected to the film formation chamber and the second substrate bearer in-out cavity, so as to pump out air in the film formation chamber and the second substrate bearer in-out cavity in case the third pump is damaged.

An embodiment of the present disclosure further provides a substrate film formation machine. The substrate film formation machine includes: a first substrate bearer in-out cavity; a second substrate bearer in-out cavity, the second substrate bearer in-out cavity being connected to the first substrate bearer in-out cavity; a film formation chamber, the film formation chamber being connected to the second substrate bearer in-out cavity; an intermediate chamber, the intermediate chamber being connected to the film formation chamber; a pump set, the pump set including a plurality of first pumps and being connected to the first substrate bearer in-out cavity, so as to pump out air in the first substrate bearer in-out cavity; a second pump, the second pump being connected to the intermediate chamber, so as to pump out air in the intermediate chamber; a third pump, the third pump being connected to the film formation chamber and the second substrate bearer in-out cavity, so as to pump out air in the film formation chamber and the second substrate bearer in-out cavity; a auxiliary pump, the auxiliary pump being connected to the film formation chamber, the second substrate bearer in-out cavity and the intermediate chamber; a first control switch, one end of the first control switch being connected to the second pump and the other end of the first control switch being connected to the intermediate chamber; a second control switch, one end of the second control switch being connected to the third pump and the other end of the second control switch being connected to the film formation chamber and the second substrate bearer in-out cavity; a third control switch, one end of the third control switch being connected to the auxiliary pump and the other end of the third control switch being connected to the film formation chamber and the second substrate bearer in-out cavity; and a fourth control switch, one end of the fourth control switch being connected to the auxiliary pump and the other end of the fourth control switch being connected to the intermediate chamber.

An embodiment of the present disclosure further provides a method of using the substrate film formation machine. The using method of the substrate film formation machine is applicable to the substrate film formation machine provided by any embodiment of the present disclosure.

The using method of the substrate film formation machine includes: determining whether the second pump and the third pump work normally; if the second pump is damaged, turning off the first control switch and the third control switch, turning on the second control switch and the fourth control switch, and starting a second auxiliary pump; and if the third pump is damaged, turning on the first control switch and the third control switch, turning off the second control switch and the fourth control switch, and starting a first auxiliary pump.

In the embodiments of the present disclosure, at least one auxiliary pump is introduced, and the auxiliary pump is connected to the film formation chamber and the second substrate bearer in-out cavity, so as to pump out air in the film formation chamber and the second substrate bearer in-out cavity in case the third pump is damaged. Alternatively, the auxiliary pump is connected to the intermediate chamber, so as to pump out air in the intermediate chamber in case the second pump is damaged, thereby solving the problem that in the conventional substrate film formation machine, if one pump is damaged, the substrate film formation machine cannot work normally and needs to be stopped for repairing, which affects the production efficiency of the substrate film formation machine. The present disclosure achieves the objective of improving the production efficiency of the substrate film formation machine.

DETAILED DESCRIPTION OF THE EMBODIMENTS

The present disclosure will be described in further detail below with reference to the accompanying drawings and embodiments. It can be understood that the embodiments described herein are merely used for illustrating the present disclosure and do not limit the present disclosure. It should be further noted that for ease of description, only a partial structure related to the present disclosure, instead of all the structure, is shown in the accompanying drawings.

Figure 1:
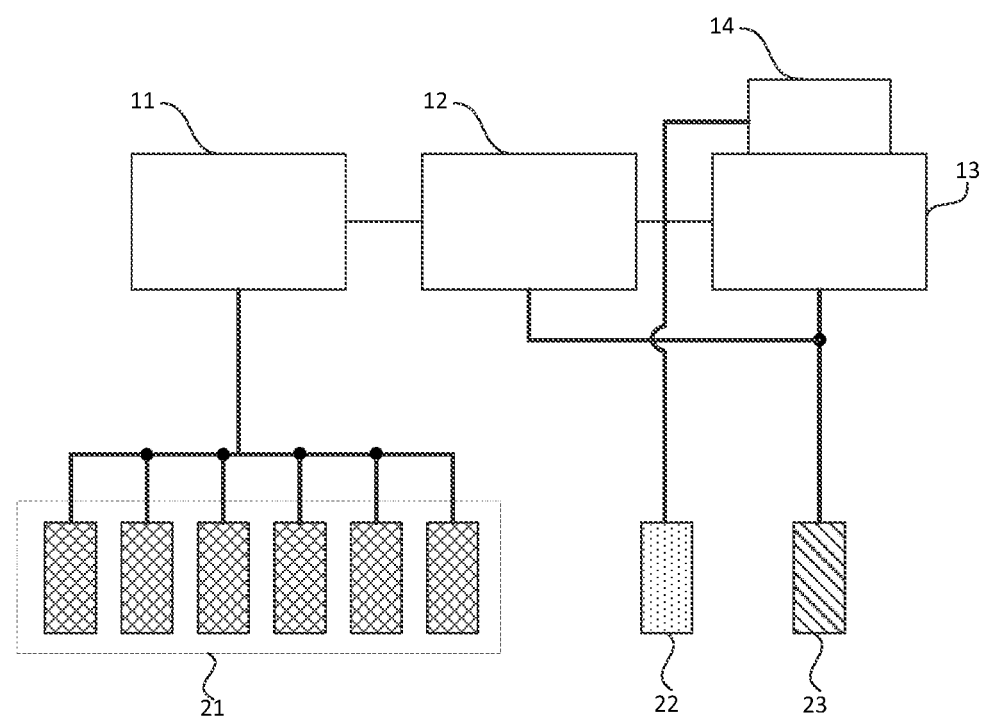
FIG. 1 is a schematic diagram of an exemplary substrate film formation machine.

FIG. 1 is a schematic diagram of a substrate film formation machine in the related art. Referring to FIG. 1, the substrate film formation machine includes: a first substrate bearer in-out cavity 11, a second substrate bearer in-out cavity 12, a film formation chamber 13, an intermediate chamber 14, a first pump set 21, a second pump 22 and a third pump 23. The second substrate bearer in-out cavity 12 is connected to the first substrate bearer in-out cavity 11. The film formation chamber 13 is connected to the second substrate bearer in-out cavity 12. The intermediate chamber 14 is connected to the film formation chamber 13. The first pump set 21 is connected to the first substrate bearer in-out cavity 11, so as to pump out air in the first substrate bearer in-out cavity 11. The second pump 22 is connected to the intermediate chamber 14, so as to pump out air in the intermediate chamber 14. The third pump 23 is connected to the film formation chamber 13 and the second substrate bearer in-out cavity 12, so as to pump out air in the film formation chamber 13 and the second substrate bearer in-out cavity 12.

When the substrate film formation machine is in a film formation process, if the second pump 22 is damaged, the second pump 22 cannot pump out air in the intermediate chamber 14, and a vacuum environment of the film formation process cannot be guaranteed. Accordingly, this will decrease the yield of manufactured array substrates. In order to avoid affecting the yield of the array substrates, the machine needs to be stopped, so as to replace the damaged second pump 22. Accordingly, this will affect the production efficiency of the substrate film formation machine.

Similarly, if the third pump 23 is damaged when the substrate film formation machine is in a film formation process, the third pump 23 cannot pump out air in the film formation chamber 13 and the second substrate bearer in-out cavity 12, and the vacuum environment of the film formation process cannot be guaranteed. Accordingly, this will decrease the yield of manufactured array substrates. In order to avoid affecting the yield of the array substrates, the machine needs to be stopped, so as to replace the damaged third pump 23. Accordingly, this will affect the production efficiency of the substrate film formation machine.

Figure 2:
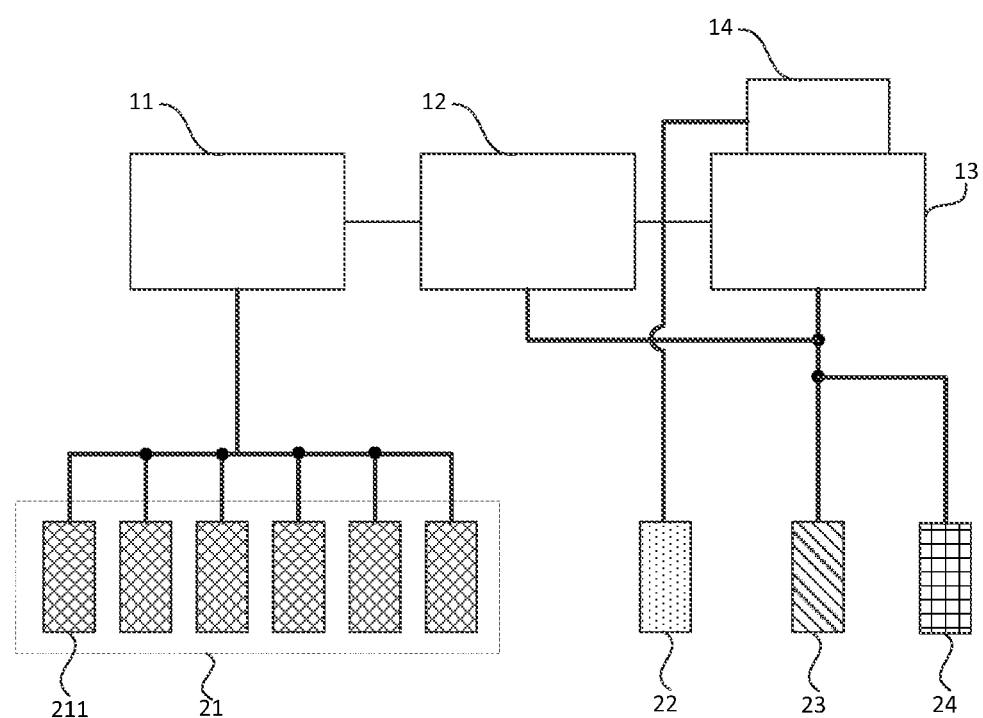
FIG. 2 is a schematic diagram of a substrate film formation machine according to an embodiment of the present disclosure.

FIG. 2 is a schematic diagram of a substrate film formation machine according to the present disclosure. Referring to FIG. 2, the substrate film formation machine includes: a first substrate bearer in-out cavity 11, a second substrate bearer in-out cavity 12, a film formation chamber 13, an intermediate chamber 14, a first pump set 21, a second pump 22, a third pump 23 and at least one auxiliary pump 24 (only one auxiliary pump 24 is arranged as an example in FIG. 2). The second substrate bearer in-out cavity 12 is connected to the first substrate bearer in-out cavity 11. The film formation chamber 13 is connected to the second substrate bearer in-out cavity 12. The intermediate chamber 14 is connected to the film formation chamber 13. The first pump set 21 is connected to the first substrate bearer in-out cavity 11, so as to pump out air in the first substrate bearer in-out cavity 11. The second pump 22 is connected to the intermediate chamber 14, so as to pump out air in the intermediate chamber 14. The third pump 23 is connected to the film formation chamber 13 and the second substrate bearer in-out cavity 12, so as to pump out air in the film formation chamber 13 and the second substrate bearer in-out cavity 12. The auxiliary pump 24 is connected to the film formation chamber 13 and the second substrate bearer in-out cavity 12, so as to pump out air in the film formation chamber 13 and the second substrate bearer in-out cavity 12 if the third pump 23 is damaged.

In this embodiment of the present disclosure, at least one auxiliary pump 24 is added and the auxiliary pump 24 is connected to the film formation chamber 13 and the second substrate bearer in-out cavity 12, so as to pump out air in the film formation chamber 13 and the second substrate bearer in-out cavity 12 in case the third pump 23 is damaged. In fact, the auxiliary pump 24 works in substitution of the third pump 23 when the third pump 23 is damaged. In this case, the damaged third pump 23 can be replaced. In this way, in the process of replacing the third pump 23, the substrate film formation machine does not need to be stopped, thereby solving the problem that in a substrate film formation machine in the related art, if the third pump is damaged, the substrate film formation machine cannot work normally and needs to be stopped for repairing, which affects the production efficiency of the substrate film formation machine. This embodiment of the present disclosure achieves the objective of improving the production efficiency of the substrate film formation machine.

Figure 3:
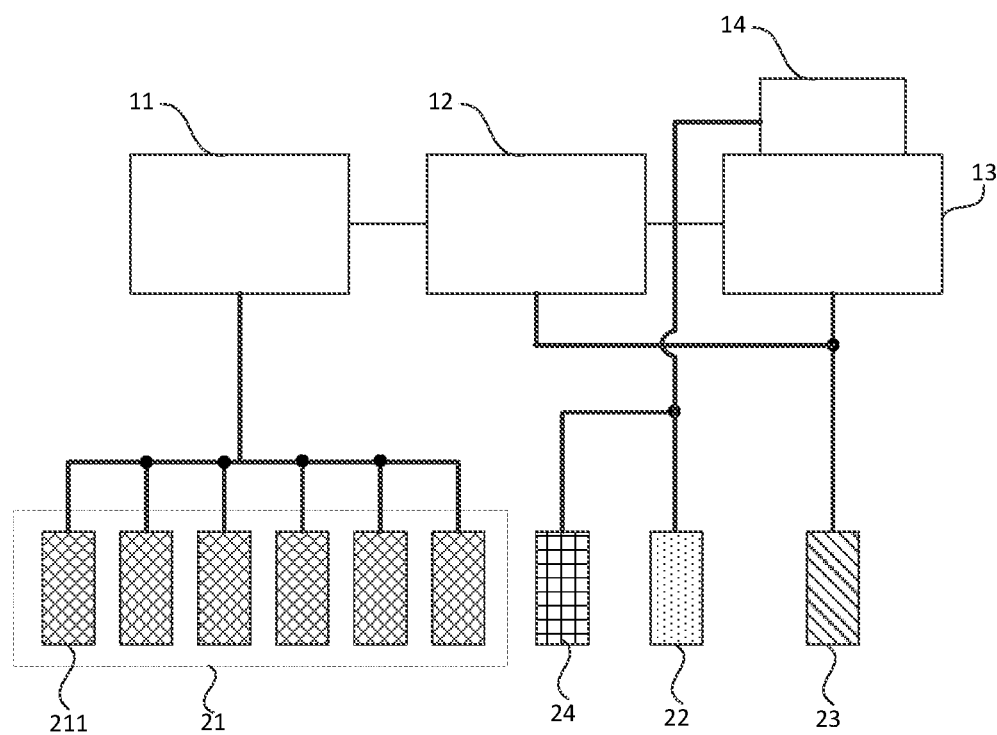
FIG. 3 is a schematic diagram of another substrate film formation machine according to an embodiment of the present disclosure.

FIG. 3 is a schematic diagram of another substrate film formation machine according to the present disclosure. Compared with the substrate film formation machine provided in FIG. 2, the auxiliary pump 24 in the substrate film formation machine provided in FIG. 3 has a different connection relationship. Referring to FIG. 3, the auxiliary pump 24 is connected to the intermediate chamber 14, so as to pump out air in the intermediate chamber 14 in case the second pump 22 is damaged. In this embodiment, at least one auxiliary pump 24 is added and the auxiliary pump 24 is connected to the intermediate chamber 14, so as to pump out air in the intermediate chamber 14 in case the second pump 22 is damaged. Accordingly the auxiliary pump 24 works in substitution of the second pump 22 when the second pump 22 is damaged. In this case, the damaged second pump 22 can be replaced. In this way, in the process of replacing the second pump 22, the substrate film formation machine does not need to be stopped, thereby solving the problem that in a substrate film formation machine in the related art, if the second pump 22 is damaged, the substrate film formation machine cannot work normally and needs to be stopped for repairing, which affects the production efficiency of the substrate film formation machine. This embodiment achieves the objective of improving the production efficiency of the substrate film formation machine.

Figure 4:
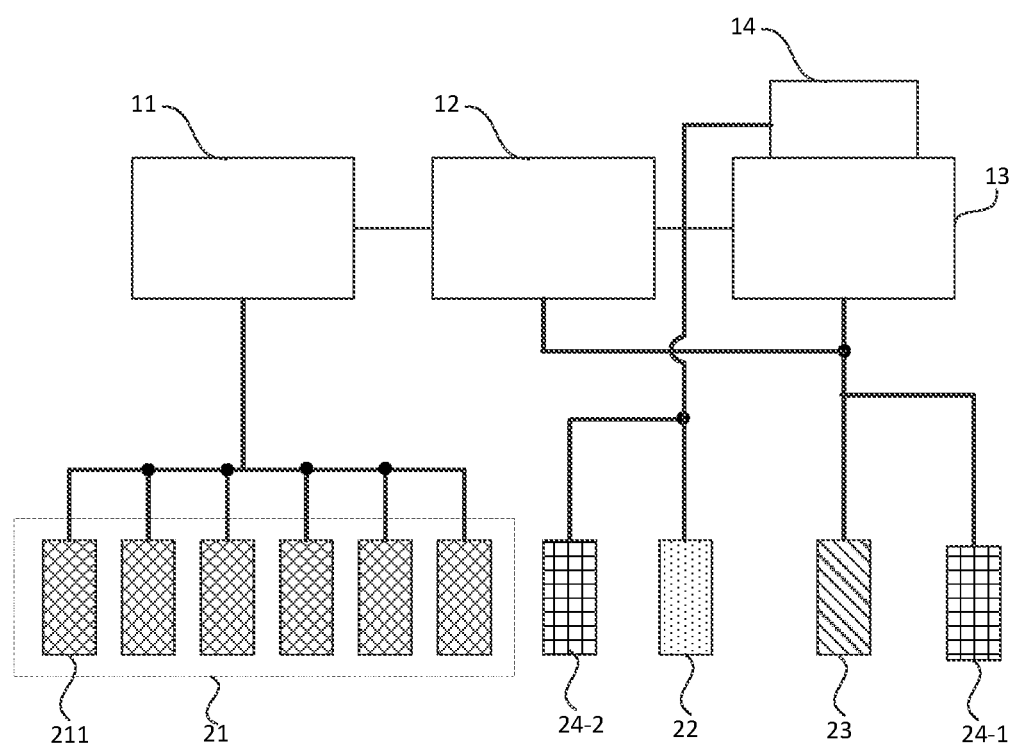
FIG. 4 is a schematic diagram of yet another substrate film formation machine according to an embodiment of the present disclosure.

FIG. 4 is a schematic diagram of still another substrate film formation machine according to the present disclosure. Referring to FIG. 4, the substrate film formation machine includes two auxiliary pumps. One auxiliary pump 24-1 is connected to the film formation chamber 13 and the second substrate bearer in-out cavity 12, so as to pump out air in the film formation chamber 13 and the second substrate bearer in-out cavity 12 in case the third pump 23 is damaged. The other auxiliary pump 24-2 is connected to the intermediate chamber 14, so as to pump out air in the intermediate chamber 14 in case the second pump 22 is damaged. In this embodiment, the auxiliary pump 24-1 is connected to the film formation chamber 13 and the second substrate bearer in-out cavity 12, and the auxiliary pump 24-2 is connected to the intermediate chamber 14, thereby solving the problem that in a substrate film formation machine in the related art, if the third pump 23 and/or the second pump 22 are/is damaged, the substrate film formation machine cannot work normally and needs to be stopped for repairing, which affects the production efficiency of the substrate film formation machine. This embodiment achieves the objective of improving the production efficiency of the substrate film formation machine.

Figure 5:
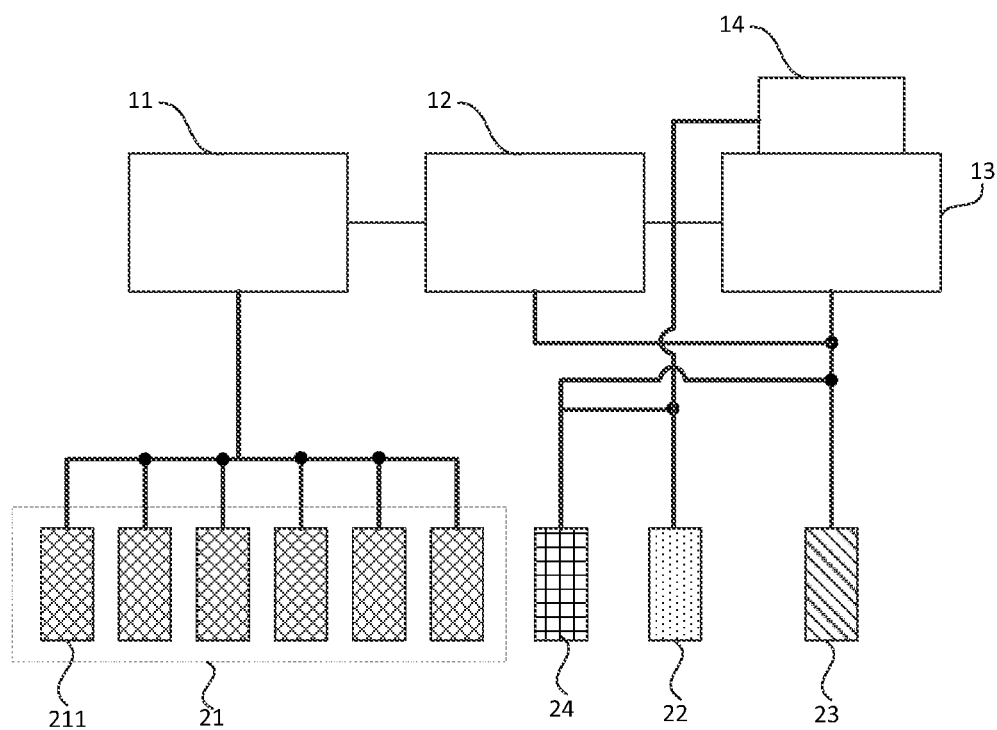
FIG. 5 is a schematic diagram of still another substrate film formation machine according to an embodiment of the present disclosure.

FIG. 5 is a schematic diagram of still another substrate film formation machine according to the present disclosure. Considering the probability that the third pump and the second pump being both damaged is low in an actual using process, in still another embodiment, referring to FIG. 5, the auxiliary pump 24 is connected to the intermediate chamber 14, the film formation chamber 13, and the second substrate bearer in-out cavity 12, so as to pump out air in the film formation chamber 13 and the second substrate bearer in-out cavity 12 in case the third pump 23 is damaged. Alternatively, it can pump out air in the intermediate chamber 14 in case the second pump 22 is damaged. In this way, the quantity of auxiliary pumps 24 to be arranged can be effectively reduced, thereby lowering the manufacturing cost of the substrate film formation machine and reducing the size of the substrate film formation machine.

Figure 6:
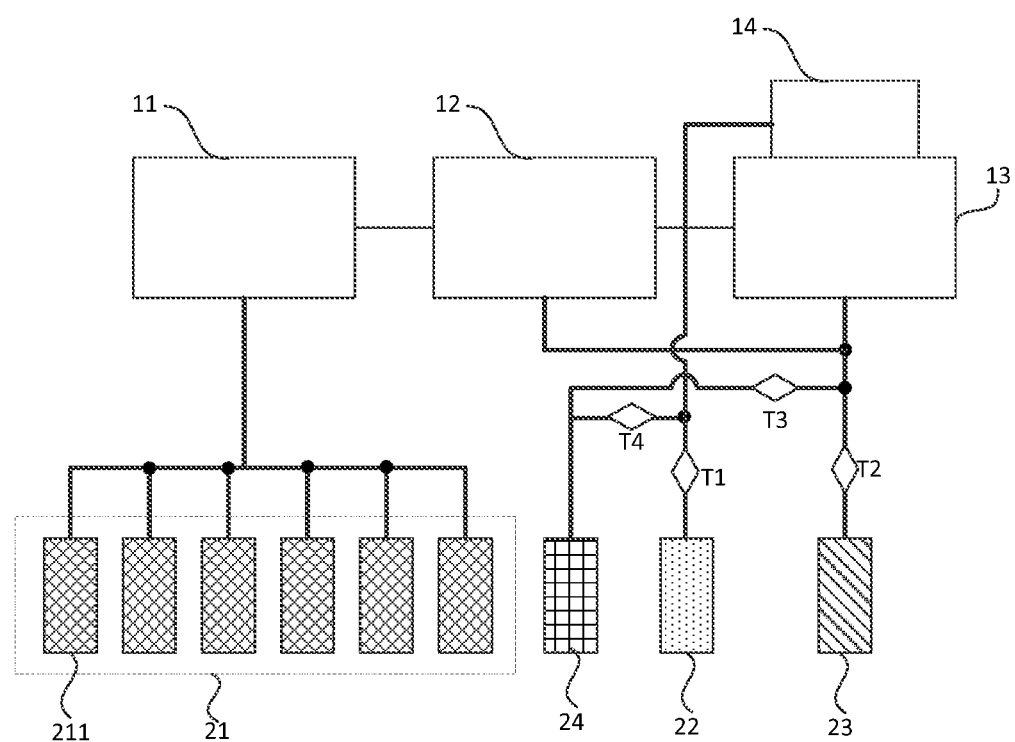
FIG. 6 is a schematic diagram of still another substrate film formation machine according to an embodiment of the present disclosure.

FIG. 6 is a schematic diagram of still another substrate film formation machine according to the present disclosure. Referring to FIG. 6, the substrate film formation machine further includes: at least one first control switch T1 (only one first control switch T1 is arranged as an example in FIG. 6), at least one second control switch T2 (only one second control switch T2 is arranged as an example in FIG. 6), at least one third control switch T3 (only one third control switch T3 is arranged as an example in FIG. 6), and at least one fourth control switch T4 (only one fourth control switch T4 is arranged as an example in FIG. 6). One end of the first control switch T1 is connected to the second pump 22, and the other end of the first control switch T1 is connected to the intermediate chamber 14. One end of the second control switch T2 is connected to the third pump 23, and the other end of the second control switch T2 is connected to the film formation chamber 13 and the second substrate bearer in-out cavity 12. One end of the third control switch T3 is connected to the auxiliary pump 24, and the other end of the third control switch T3 is connected to the film formation chamber 13 and the second substrate bearer in-out cavity 12. One end of the fourth control switch T4 is connected to the auxiliary pump 24, and the other end of the fourth control switch T4 is connected to the intermediate chamber 14.

In actual working, when the second pump 22 and the third pump 23 both can work normally, the first control switch T1 and the second control switch T2 are both turned on, and the third control switch T3 and the fourth control switch T4 are both turned off. If the second pump 22 is damaged, the first control switch T1 is turned off, the fourth control switch T4 is turned on, the second control switch T2 is turned on, and the third control switch T3 is turned off. If the third pump 23 is damaged, the second control switch T2 is turned off, the third control switch T3 is turned on, the first control switch T1 is turned on, and the fourth control switch T4 is turned off.

By introducing the first control switch T1, the second control switch T2, the third control switch T3, and the fourth control switch T4 to the substrate film formation machine, working states of the auxiliary pump 24, the second pump 22, and the third pump 23 can be controlled more effectively, such that the substrate film formation machine stays in an optimal working state and the production efficiency of the substrate film formation machine is improved.

Figure 7:
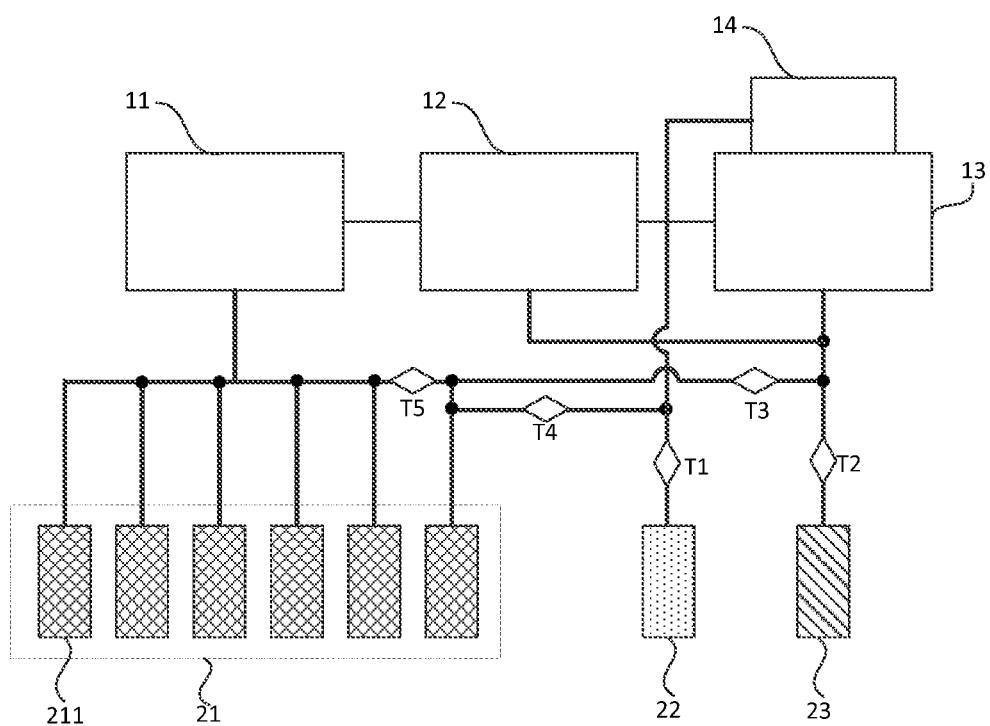
FIG. 7 is a schematic diagram of still another substrate film formation machine according to an embodiment of the present disclosure.

FIG. 7 is a schematic diagram of still another substrate film formation machine according to the present disclosure. Referring to FIG. 7, in the substrate film formation machine, the first pump set 21 includes M first pumps 211 (for example, M=6 in FIG. 7). The first pumps 211 are all connected to the first substrate bearer in-out cavity 11, so as to pump out air in the first substrate bearer in-out cavity 11. N first pumps 211 in the first pump set 21 are reused as the auxiliary pumps (for example, N=1 in FIG. 7), where M is a positive integer greater than or equal to 2, N is a positive integer greater than or equal to 1, and N<M. In the foregoing technical solution, by reusing N first pumps 211 in the first pump set 21 as the auxiliary pumps, it is unnecessary to configure any additional auxiliary pump for the substrate film formation machine, and the size of the substrate film formation machine can be reduced without affecting normal operation of the substrate film formation machine.

Still referring to FIG. 7, in still another embodiment, the substrate film formation machine can further include at least one fifth control switch T5 (for example, only one fifth control switch T5 is included in FIG. 7). One end of the fifth control switch T5 is connected to the first pump 211 that is reused as the auxiliary pump, and the other end of the fifth control switch T5 is connected to the first substrate bearer in-out cavity 11. In actual working, when the second pump 22 and the third pump 23 both can work normally, the first control switch T1, the second control switch T2 and the fifth control switch T5 are all turned on, and the third control switch T3 and the fourth control switch T4 are both turned off. The first pump 211 reused as the auxiliary pump is used for pumping out air in the first substrate bearer in-out cavity 11. If the second pump 22 is damaged, the fifth control switch T5 and the first control switch T1 are turned off, the fourth control switch T4 is turned on, the second control switch T2 is turned on, and the third control switch T3 is turned off. The first pump 211 reused as the auxiliary pump is used for pumping out air in the intermediate chamber 14. If the third pump 23 is damaged, the fifth control switch T5 and the second control switch T2 are turned off, the third control switch T3 is turned on, the first control switch T1 is turned on, and the fourth control switch T4 is turned off. The first pump 211 reused as the auxiliary pump is used for pumping out air in the film formation chamber 13 and the second substrate bearer in-out cavity 12.

Figure 8:
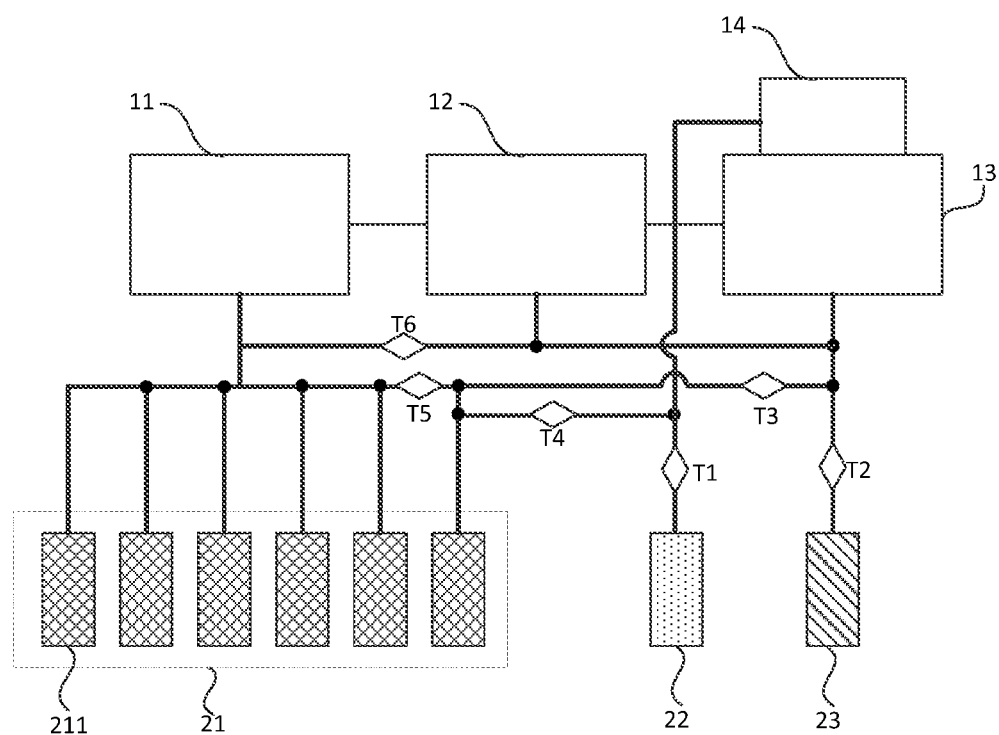
FIG. 8 is a schematic diagram of still another substrate film formation machine according to an embodiment of the present disclosure.

FIG. 8 is a schematic diagram of still another substrate film formation machine according to the present disclosure. Referring to FIG. 8, in still another embodiment, the substrate film formation machine further includes at least one sixth control switch T6. One end of the sixth control switch T6 is connected to the third pump 23, and the other end of the sixth control switch T6 is connected to the first substrate bearer in-out cavity 11. In this way, air in the first substrate bearer in-out cavity 11 can be pumped out by using the third pump 23 and the first pump set 21 at the same time, so as to reduce the time required for pumping out air in the first substrate bearer in-out cavity 11 and improve the production efficiency of the substrate film formation machine.

Figure 10:
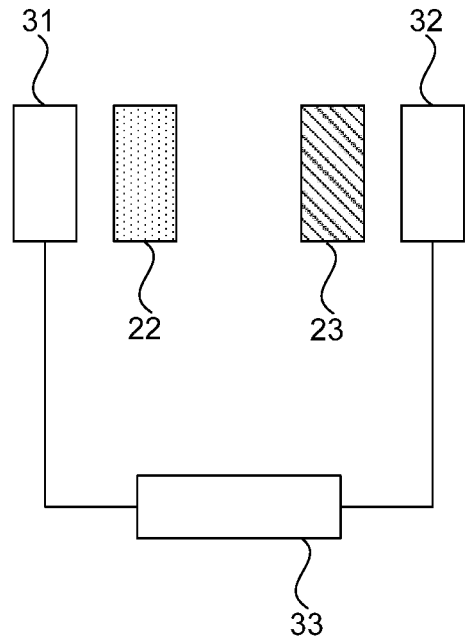
FIG. 10 is a block diagram of a partial structure of still another substrate film formation machine according to an embodiment of the present disclosure.

As shown in FIG. 10, in some embodiments, the substrate film formation machine further includes a first monitoring device 31, a second monitoring device 32, and an alarm device 33. The alarm device 33 is in communication with the first monitoring device 31 and the second monitoring device 32.

The first monitoring device 31 is configured to monitor whether the second pump 22 works normally, and send a first alarm signal to the alarm device 33 when the second pump 22 does not work normally.

The second monitoring device 32 is configured to monitor whether the third pump 23 works normally, and send a second alarm signal to the alarm device 33 when the third pump 23 does not work normally. The second alarm signal is different from the first alarm signal.

When receiving the first alarm signal, the alarm device 33 is configured to play a pre-recorded first alarm sound or display a first alarm icon by using a display screen. When receiving the second alarm signal, the alarm device is configured to play a pre-recorded second alarm sound or display a second alarm icon by using a display screen.

In some embodiments, the substrate film formation machine further includes a first vacuum gauge and a second vacuum gauge.

The first vacuum gauge is arranged in the film formation chamber 13 or the second substrate bearer in-out cavity 12, and is connected to the first monitoring device. The first vacuum gauge is configured to measure vacuum degrees of the film formation chamber 13 and the second substrate bearer in-out cavity 12.

The second vacuum gauge is arranged in the intermediate chamber 14 and is connected to the second monitoring device. The second vacuum gauge is configured to measure a vacuum degree of the intermediate chamber 14.

During running of the substrate film formation machine, the first monitoring device determines, by detecting the vacuum degrees of the film formation chamber 13 and the second substrate bearer in-out cavity 12, whether the second pump 22 works normally. The second monitoring device determines, by detecting the vacuum degree of the intermediate chamber 14, whether the third pump 23 works normally.

For example, the film formation process of array substrates needs to be carried out in an environment with an air pressure of $10^{-8}$ Pa. According to the design capacity of the second pump 22, the second pump 22 can change the air pressure in the film formation chamber 13 and the second substrate bearer in-out cavity 12 from the atmospheric pressure to $10^{-8}$ Pa by working normally for 10 hours. At the $15^{th}$ minute of the tenth hour, if the first monitoring device detects that the air pressure in the film formation chamber 13 and the second substrate bearer in-out cavity 12 is $10^{-6}$ Pa, it is considered that the second pump 22 does not work normally. It should be noted that, in this embodiment, $10^{-8}$ Pa and $10^{-6}$ Pa are only used as examples for illustration. For another example, during the film formation process of array substrates, the air pressure in the film formation chamber 13 and the second substrate bearer in-out cavity 12 needs to be maintained at $10^{-8}$ Pa. When the first monitoring device detects that the air pressure in the film formation chamber 13 and the second substrate bearer in-out cavity 12 starts to rise and reaches a first threshold, the first monitoring device sends a leakage alarm to prompt working staff that air is leaking from the substrate film formation machine.

In some other embodiments, the first monitoring device is configured to determine, by monitoring operation parameters of the second pump 22, whether the second pump 22 works normally. The second monitoring device is configured to determine, by monitoring operation parameters of the third pump 23, whether the third pump 23 works normally. The operation parameters include, for example, a working current, a working voltage and a pumping speed.

Figure 9:
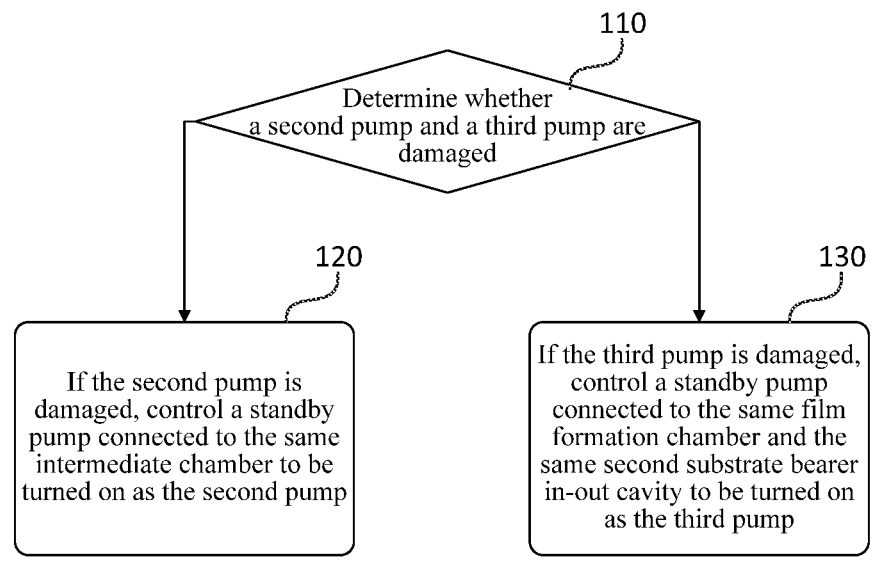
FIG. 9 is a flowchart of a method of using a substrate film formation machine according to an embodiment of the present disclosure.

An embodiment of the present disclosure further provides a method of using a substrate film formation machine. The method of using the substrate film formation machine is applicable to the substrate film formation machines provided in the foregoing embodiments of the present disclosure. FIG. 9 is a flowchart of the method of using the substrate film formation machine according to an embodiment of the present disclosure. Referring to FIG. 9, the method of using the substrate film formation machine includes the following steps:

In step S110, whether a second pump and a third pump are damaged is determined.

In step S120, if the second pump is damaged, a auxiliary pump connected to the same intermediate chamber as the second pump is controlled to be turned on.

In step S130, if the third pump is damaged, a auxiliary pump connected to the same film formation chamber and the same second substrate bearer in-out cavity as the third pump is controlled to be turned on.

In this embodiment of the present disclosure, if the second pump is damaged, the auxiliary pump connected to the same intermediate chamber as the damaged second pump is controlled to be turned on. If the third pump is damaged, the auxiliary pump connected to the same film formation chamber and the same second substrate bearer in-out cavity as the damaged third pump is controlled to be turned on. Therefore, this embodiment of the present disclosure solves the problem that in a substrate film formation machine in the related art, if one pump is damaged, the substrate film formation machine cannot work normally and needs to be stopped for repairing, which affects the production efficiency of the substrate film formation machine. This embodiment achieves the objective of improving the production efficiency of the substrate film formation machine.

It should be noted that in S120, if the second pump is damaged, the substrate film formation machine can also automatically control the auxiliary pump connected to the same intermediate chamber as the damaged second pump to be turned on, or working staff can manually control the auxiliary pump connected to the same intermediate chamber as the damaged second pump to be turned on. Similarly, in S130, if the third pump is damaged, the substrate film formation machine can also automatically control the auxiliary pump connected to the same film formation chamber and the same second substrate bearer in-out cavity as the damaged third pump to be turned on, or the working staff can manually control the auxiliary pump connected to the same film formation chamber and the same second substrate bearer in-out cavity as the damaged third pump to be turned on.

In another embodiment, after S110, the method further includes: sending out an alarm signal if the second pump or the third pump is damaged. An alarm signal is sent out if the second pump or the third pump is damaged, so as to prompt the working staff to take actions when the second pump or the third pump is damaged, for example, replacing the damaged second pump or third pump.

In another embodiment, the method of using a substrate film formation machine is applicable to the substrate film formation machines in FIG. 5 and FIG. 6. The using method of the substrate film formation machine includes: determining whether the second pump and the third pump work normally; if the second pump is damaged, turning off the first control switch and the third control switch, turning on the second control switch and the fourth control switch, and starting a second auxiliary pump; and if the third pump is damaged, turning on the first control switch and the third control switch, turning off the second control switch and the fourth control switch, and starting a first auxiliary pump.

Optionally, after the step of determining whether the second pump and the third pump are damaged, the method of using the substrate film formation machine further includes: sending out a first alarm signal if the second pump is damaged; and sending out a second alarm signal if the third pump is damaged, and the first alarm signal is different from the second alarm signal.

Optionally, the method of using the substrate film formation machine further includes: sending out a third alarm signal when the second pump and the third pump are both damaged, to prompt working staff that the machine needs to be stopped for an overhaul.

There are many manners of sending out an alarm signal. In still another embodiment, a pre-recorded alarm sound is played or an icon with an alarm function is displayed by using a display screen.

In still another embodiment, the step of sending out an alarm signal if the second pump or the third pump is damaged may include: sending out a first alarm signal if the second pump is damaged; and sending out a second alarm signal if the third pump is damaged, the first alarm signal is different from the second alarm signal. By configuring the first alarm signal and the second alarm signal to be different, it can help the working staff to quickly locate the damaged pump, so that the working staff repairs the substrate film formation machine more efficiently.

It should be noted that described above are merely preferred embodiments of the present disclosure and used technical principles. Persons skilled in the art will understand that the present disclosure is not limited to the specific embodiments described herein. For persons skilled in the art, various obvious changes, readjustments, mutual combinations and replacements can be carried out without departing from the protection scope of the present disclosure. Therefore, although the present disclosure has been described in detail through the foregoing embodiments, the present disclosure is not limited to the foregoing embodiments. The present disclosure can further include more other equivalent embodiments without departing from the conception of the present disclosure. The scope of the present disclosure is subject to the scope of the appended claims.

What is claimed is:

1. A substrate film formation machine, comprising:
a first substrate bearer in-out cavity;
a second substrate bearer in-out cavity connected to the first substrate bearer in-out cavity;
a film formation chamber connected to the second substrate bearer in-out cavity;
an intermediate chamber connected to the film formation chamber;
a pump set comprising a plurality of first pumps that are connected to the first substrate bearer in-out cavity, so as to pump out air in the first substrate bearer in-out cavity;
a second pump connected to the intermediate chamber, so as to pump out air in the intermediate chamber;
a third pump connected to the film formation chamber and the second substrate bearer in-out cavity, so as to pump out air in the film formation chamber and the second substrate bearer in-out cavity;
wherein at least one of the plurality of first pumps is reused as an auxiliary pump configured to pump out air in the first substrate bearer in-out cavity when both the second pump and the third pump work normally, pump out air in the intermediate chamber when the second pump is damaged, and pump out air in the film formation chamber and the second substrate bearer in-out cavity when the third pump is damaged; the number of the auxiliary pump is smaller than the total number of the first pumps.

2. The substrate film formation machine according to claim 1, further comprising at least one first control switch, wherein one end of the first control switch is connected to the first pump reused as the auxiliary pump, and the other end of the first control switch is connected to the first substrate bearer in-out cavity.

3. The substrate film formation machine according to claim 1, further comprising at least one second control switch, wherein one end of the second control switch is connected to the third pump, and the other end of the second control switch is connected to the first substrate bearer in-out cavity.

4. The substrate film formation machine according to claim 1, further comprising a first monitoring device, a second monitoring device and an alarm device;
wherein the first monitoring device is configured to monitor whether the second pump works normally, and send a first alarm signal to the alarm device when the second pump does not work normally;
the second monitoring device is configured to monitor whether the third pump works normally, and send a second alarm signal to the alarm device when the third pump does not work normally; and
when receiving the first alarm signal, the alarm device is configured to play a pre-recorded first alarm sound or display a first alarm icon by using a display screen, and when receiving the second alarm signal, the alarm device is configured to play a pre-recorded second alarm sound or display a second alarm icon by using a display screen.

5. The substrate film formation machine according to claim 4, further comprising a first vacuum gauge and a second vacuum gauge, wherein the first vacuum gauge is arranged in the film formation chamber or the second substrate bearer in-out cavity, and the second vacuum gauge is arranged in the intermediate chamber.

6. The substrate film formation machine according to claim 4, wherein the first monitoring device is configured to determine, by monitoring operation parameters of the second pump, whether the second pump works normally; the second monitoring device is configured to determine, by monitoring operation parameters of the third pump, whether the third pump works normally; and the operation parameters comprise a working current, a working voltage, and a pumping speed.

7. A substrate film formation machine, comprising:
a first substrate bearer in-out cavity;
a second substrate bearer in-out cavity connected to the first substrate bearer in-out cavity;
a film formation chamber connected to the second substrate bearer in-out cavity;
an intermediate chamber connected to the film formation chamber;
a pump set comprising a plurality of first pumps that are connected to the first substrate bearer in-out cavity, so as to pump out air in the first substrate bearer in-out cavity;
a second pump connected to the intermediate chamber, so as to pump out air in the intermediate chamber;
a third pump connected to the film formation chamber and the second substrate bearer in-out cavity, so as to pump out air in the film formation chamber and the second substrate bearer in-out cavity;
wherein at least one of the plurality of first pumps is reused as an auxiliary pump configured to pump out air in the first substrate bearer in-out cavity when both the second pump and the third pump work normally, pump out air in the intermediate chamber when the second pump is damaged, and pump out air in the film formation chamber and the second substrate bearer in-out cavity when the third pump is damaged; the number of the auxiliary pump is smaller than the total number of the first pumps;
a first control switch, one end of the first control switch being connected to the second pump and the other end of the first control switch being connected to the intermediate chamber;
a second control switch, one end of the second control switch being connected to the third pump and the other end of the second control switch being connected to the film formation chamber and the second substrate bearer in-out cavity;
a third control switch, one end of the third control switch being connected to the auxiliary pump and the other end of the third control switch being connected to the film formation chamber and the second substrate bearer in-out cavity; and
a fourth control switch, one end of the fourth control switch being connected to the auxiliary pump and the other end of the fourth control switch being connected to the intermediate chamber.

8. The substrate film formation machine according to claim 7, further comprising at least one fifth control switch, wherein one end of the fifth control switch is connected to the first pump reused as the auxiliary pump, and the other end of the fifth control switch is connected to the first substrate bearer in-out cavity.

9. The substrate film formation machine according to claim 7, further comprising at least one sixth control switch, wherein one end of the sixth control switch is connected to the third pump and the other end of the sixth control switch is connected to the first substrate bearer in-out cavity.

10. The substrate film formation machine according to claim 7, wherein when the second pump and the third pump both work normally, the first control switch and the second control switch are turned on, and the third control switch and the fourth control switch are both turned off;
when the second pump is damaged, the first control switch is turned off, the fourth control switch is turned on, the second control switch is turned on, and the third control switch is turned off; and
when the third pump is damaged, the second control switch is turned off, the third control switch is turned on, the first control switch is turned on, and the fourth control switch is turned off.

11. The substrate film formation machine according to claim 7, further comprising a first monitoring device, a second monitoring device and an alarm device;
wherein the first monitoring device is configured to monitor whether the second pump works normally, and send a first alarm signal to the alarm device when the second pump does not work normally;
the second monitoring device is configured to monitor whether the third pump works normally, and send a second alarm signal to the alarm device when the third pump does not work normally; and
when receiving the first alarm signal, the alarm device is configured to play a pre-recorded first alarm sound or display a first alarm icon by using a display screen, and when receiving the second alarm signal, the alarm device is configured to play a pre-recorded second alarm sound or display a second alarm icon by using a display screen.

12. The substrate film formation machine according to claim 11, further comprising a first vacuum gauge and a second vacuum gauge, wherein the first vacuum gauge is arranged in the film formation chamber or the second substrate bearer in-out cavity, and the second vacuum gauge is arranged in the intermediate chamber.

13. The substrate film formation machine according to claim 11, wherein the first monitoring device is configured to determine, by monitoring operation parameters of the second pump, whether the second pump works normally; the second monitoring device is configured to determine, by monitoring operation parameters of the third pump, whether the third pump works normally; and the operation parameters comprise a working current, a working voltage and a pumping speed.

14. A method of using the substrate film formation machine according to claim 7, comprising:
determining whether the second pump and the third pump work normally;
if the second pump is damaged, turning off the first control switch and the third control switch, turning on the second control switch and the fourth control switch, and starting the auxiliary pump; and
if the third pump is damaged, turning on the first control switch and the third control switch, turning off the second control switch and the fourth control switch, and starting the auxiliary pump.

15. The method according to claim 14, wherein after the determining whether the second pump and the third pump are damaged, the method further comprises:
   sending out a first alarm signal if the second pump is damaged; and
   sending out a second alarm signal if the third pump is damaged, the first alarm signal being different from the second alarm signal.

16. The method according to claim 14, wherein after the determining whether the second pump and the third pump are damaged, the method further comprises: sending out a third alarm signal when the second pump and the third pump are both damaged.

17. The substrate film formation machine according to claim 1, further comprising at least one sixth control switch, wherein one end of the sixth control switch is connected to the third pump and the other end of the sixth control switch is connected to the first substrate bearer in-out cavity.

18. The substrate film formation machine according to claim 17, wherein the third pump is further configured to pump out air in the first substrate bearer in-out cavity when the sixth control switch is switched on.

19. The substrate film formation machine according to claim 9, wherein the third pump is further configured to pump out air in the first substrate bearer in-out cavity when the sixth control switch is switched on.

20. The method according to claim 14, further comprising:
   switching on at least one sixth switch connected between the third pump and the first substrate bearer in-out cavity; and
   pumping out air in the first substrate bearer in-out cavity by the third pump.

* * * * *